(12) United States Patent
Kerr et al.

(10) Patent No.: US 6,790,663 B2
(45) Date of Patent: *Sep. 14, 2004

(54) METHODS OF CONTACTING LINES AND METHODS OF FORMING AN ELECTRICAL CONTACT IN A SEMICONDUCTOR DEVICE

(75) Inventors: Robert Kerr, Boise, ID (US); Brian Shirley, Boise, ID (US); Luan C. Tran, Meridian, ID (US); Tyler A. Lowrey, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 247 days.

This patent is subject to a terminal disclaimer.

(21) Appl. No.: 10/098,659

(22) Filed: Mar. 12, 2002

(65) Prior Publication Data

US 2002/0094675 A1 Jul. 18, 2002

Related U.S. Application Data

(63) Continuation of application No. 09/146,115, filed on Sep. 2, 1998, now Pat. No. 6,380,023.

(51) Int. Cl.[7] .......................................... H01L 21/4763
(52) U.S. Cl. ........................ 435/620; 438/675; 257/377
(58) Field of Search .............................. 257/306, 377; 438/253, 396, 592, 597, 620, 672–675

(56) References Cited

U.S. PATENT DOCUMENTS

| | | | |
|---|---|---|---|
| 4,281,448 A | 8/1981 | Barry et al. | ................... 29/577 |
| 4,516,147 A | 5/1985 | Komatsu et al. | |
| 4,936,928 A | 6/1990 | Shaw et al. | ................... 148/334 |
| 5,162,890 A | 11/1992 | Butler | ......................... 257/306 |
| 5,166,096 A | 11/1992 | Cote et al. | |

(List continued on next page.)

OTHER PUBLICATIONS

Shenai, K., "A high–density, self–aligned power MOSFET structure fabricated using sacrificial spacer technology" Electron Devices, IEEE Transactions on Electron Devices, vol. 39, Issue 5, May 1992, pp. 1252–1255.

Wolf, S. "Silicon Processing for the VLSI Era," vol. 3: The Submicron MOSFET, Lattice Press 1995, pp. 634–636.

Stanley Wolf, Ph.D., "Silicon Processing for the VLSI Era," vol. 3: The Submicron MOSFET, Lattice Press, 1995, pp. 136–138 and 232–234.

*Primary Examiner*—Matthew Smith
*Assistant Examiner*—Calvin Lee
(74) *Attorney, Agent, or Firm*—Wells St. John P.S.

(57) ABSTRACT

Methods of forming contacts, methods of contacting lines, methods of operating integrated circuitry, and related integrated circuitry constructions are described. In one embodiment, a plurality of conductive lines are formed over a substrate and diffusion regions are formed within the substrate elevationally below the lines. The individual diffusion regions are disposed proximate individual conductive line portions and collectively define therewith individual contact pads with which electrical connection is desired. Insulative material is formed over the conductive line portions and diffusion regions, with contact openings being formed therethrough to expose portions of the individual contact pads. Conductive contacts are formed within the contact openings and in electrical connection with the individual contact pads. In a preferred embodiment, the substrate and diffusion regions provide a pn junction which is configured for biasing into a reverse-biased diode configuration. In operation, the pn junction is sufficiently biased to preclude electrical shorting between the conductive line and the substrate for selected magnitudes of electrical current provided through the conductive line and the conductive material forming the conductive contacts.

20 Claims, 3 Drawing Sheets

U.S. PATENT DOCUMENTS

| | | |
|---|---|---|
| 5,173,752 A | 12/1992 | Motonami et al. .......... 257/309 |
| 5,206,187 A | 4/1993 | Doan et al. ................ 437/192 |
| 5,243,219 A | 9/1993 | Katayama .................. 287/740 |
| 5,272,367 A | 12/1993 | Dennison et al. ........... 257/306 |
| 5,278,082 A | 1/1994 | Kawamura |
| 5,317,193 A | 5/1994 | Watanabe ................... 257/774 |
| 5,444,003 A | 8/1995 | Wang et al. .................. 437/31 |
| 5,510,648 A | 4/1996 | Davies et al. ............... 257/657 |
| 5,547,892 A | 8/1996 | Wuu et al. ..................... 437/52 |
| 5,552,620 A | 9/1996 | Lu et al. ...................... 437/195 |
| 5,591,662 A | 1/1997 | Zambrano .................... 437/57 |
| 5,600,170 A | 2/1997 | Sugiyama et al. |
| 5,612,240 A | 3/1997 | Chang ......................... 437/44 |
| 5,652,174 A | 7/1997 | Wuu et al. ..................... 437/60 |
| 5,668,021 A | 9/1997 | Subramanian et al. ...... 438/282 |
| 5,686,331 A | 11/1997 | Song ............................ 437/41 |
| 5,707,883 A | 1/1998 | Tabara ........................ 437/40 |
| 5,710,450 A | 1/1998 | Chau et al. ................. 257/344 |
| 5,731,610 A | 3/1998 | Rhodes ....................... 257/309 |
| 5,736,441 A | 4/1998 | Chen ........................ 438/255 |
| 5,747,359 A | 5/1998 | Yuan et al. ................. 437/186 |
| 5,763,321 A | 6/1998 | Ohshima et al. ........... 438/618 |
| 5,808,320 A | 9/1998 | Dennison .................... 257/68 |
| 5,811,350 A | 9/1998 | Dennison ................... 438/597 |
| 5,814,886 A | 9/1998 | Mano |
| 5,838,068 A | 11/1998 | Tang |
| 5,858,832 A | 1/1999 | Pan ............................ 438/230 |
| 5,864,155 A | 1/1999 | Melzner ...................... 257/306 |
| 5,866,927 A | 2/1999 | Cho et al. ................... 257/296 |
| 5,874,359 A | 2/1999 | Liaw et al. ................. 438/640 |
| 5,885,890 A | 3/1999 | Dennison ................... 438/597 |
| 5,891,780 A | 4/1999 | Hasegawa et al. .......... 438/278 |
| 5,895,269 A | 4/1999 | Wang et al. |
| 5,895,939 A | 4/1999 | Ueno |
| 5,897,350 A | 4/1999 | Lee et al. ................... 438/238 |
| 5,899,712 A | 5/1999 | Choi et al. ................. 438/163 |
| 5,912,492 A | 6/1999 | Chang et al. ............... 257/344 |
| 5,930,618 A | 7/1999 | Sun et al. ................... 438/240 |
| 5,946,578 A | 8/1999 | Fujii .......................... 438/300 |
| 5,960,318 A | 9/1999 | Peschke et al. ............. 438/637 |
| 5,965,924 A | 10/1999 | Yen |
| 5,970,360 A | 10/1999 | Cheng et al. ............... 438/398 |
| 5,972,759 A * | 10/1999 | Liaw .......................... 438/296 |
| 5,990,524 A | 11/1999 | En et al. |
| 6,008,094 A | 12/1999 | Krivokapic et al. |
| 6,083,786 A * | 7/2000 | Liang ......................... 438/238 |
| 6,093,609 A | 7/2000 | Chuang ...................... 438/286 |
| 6,097,103 A | 8/2000 | Ishigaki ...................... 257/903 |
| 6,133,103 A | 10/2000 | Lee et al. ................... 438/276 |
| 6,242,781 B1 | 6/2001 | Batra et al. |

* cited by examiner

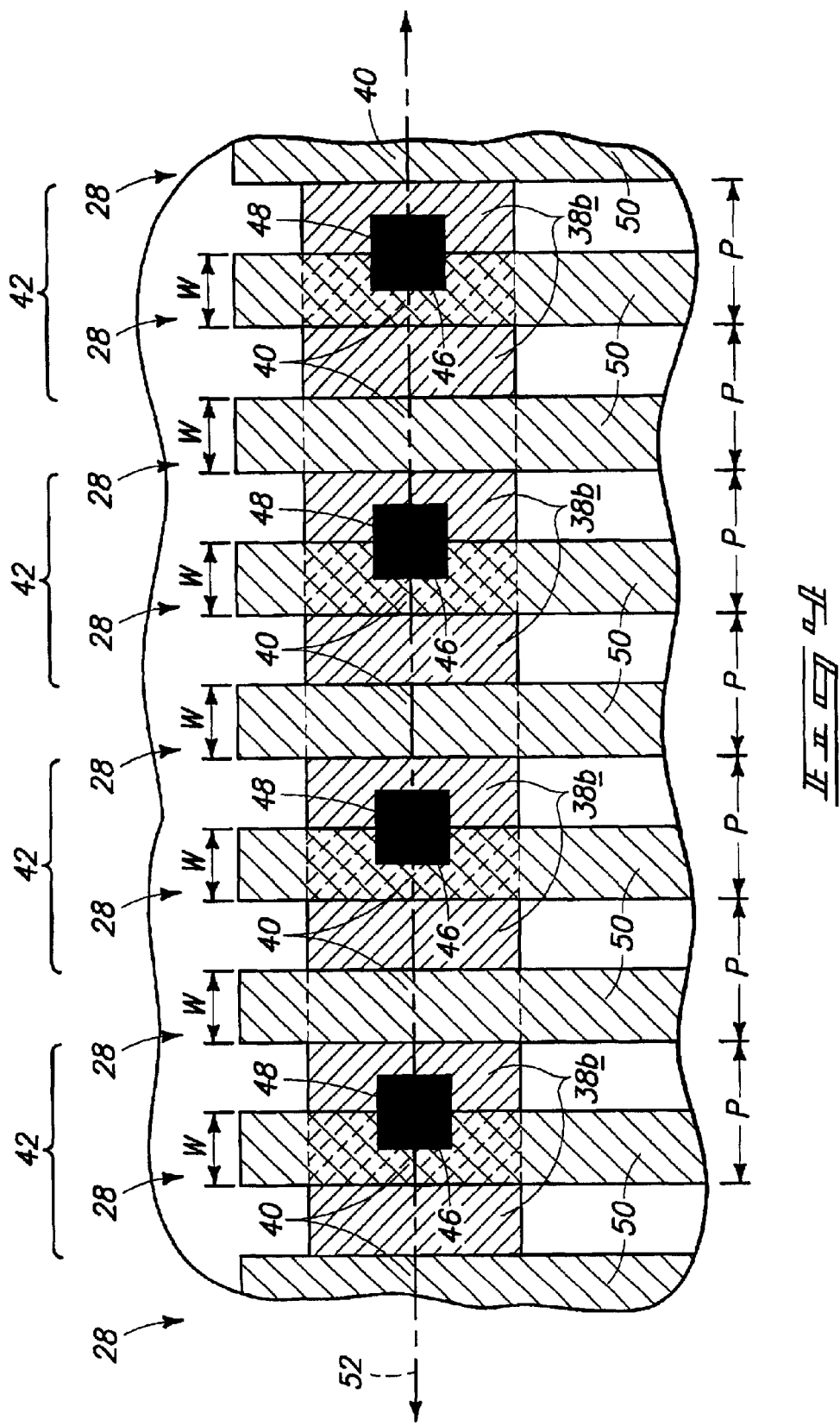

METHODS OF CONTACTING LINES AND METHODS OF FORMING AN ELECTRICAL CONTACT IN A SEMICONDUCTOR DEVICE

RELATED PATENT DATA

This patent application is a Continuation Application of U.S. patent application Ser. No. 09/146,115, filed on Sep. 2, 1998, entitled "Methods of Forming Contacts, Methods of Contacting Lines, Methods of Operating Integrated Circuitry, and Integrated Circuits," naming Robert Kerr, Brian M. Shirley, Luan C. Tran, and Tyler A. Lowrey as inventors, now U.S. Pat. No. 6,380,023 B2, the disclosure of which is hereby incorporated by reference.

TECHNICAL FIELD

This invention relates to methods of forming contacts, to methods of contacting lines, and to methods of operating integrated circuitry. The invention also relates to integrated circuits.

BACKGROUND OF THE INVENTION

Conductive lines which are utilized in integrated circuitry are often formed with widened areas called contact or landing pads. The purpose of these pads is to provide an extra degree of protection should a misalignment occur between a contact opening which is formed over the line. While advantages are gained in reducing the chances of a misalignment-induced failure, valuable wafer real estate is consumed by the widened pads.

Referring to FIG. 1, a portion of an exemplary prior art layout is shown generally at 10 and includes conductive lines 12, 14 and 16 having widened contact pads 18, 20 and 22, respectively. To conserve wafer real estate, it is usually desirable to provide conductive lines 12, 14, 16 to have a minimum pitch which is defined in large part by the minimum photolithographic feature size used to fabricate the circuitry. Minimizing the pitch of the lines ensures that the space between the lines, represented at S, is as small as possible. Yet, to ensure that subsequently formed contacts to the conductive lines do not short to the substrate, the above-described widened contact pads are used. A design trade-off, however, is that in order to maintain a desired pitch between the conductive lines, and to avoid forming the contact pads too close together, the contact pads must necessarily be moved outwardly of one another. For example, in FIG. 1, contact pad 18 is moved outward in the direction of arrow A. Other contact pads can be spaced even further out depending on the dimensions of the contact pads. This results in consumption of valuable wafer real estate.

SUMMARY OF THE INVENTION

Methods of forming contacts, methods of contacting lines, methods of operating integrated circuitry, and related integrated circuitry constructions are described. In one embodiment, a plurality of conductive lines are formed over a substrate and diffusion regions are formed within the substrate elevationally below the lines. The individual diffusion regions are disposed proximate individual conductive line portions and collectively define therewith individual contact pads with which electrical connection is desired. Insulative material is formed over the conductive line portions and diffusion regions, with contact openings being formed therethrough to expose portions of the individual contact pads. Conductive contacts are formed within the contact openings and in electrical connection with the individual contact pads. In a preferred embodiment, the substrate and diffusion regions provide a pn junction which is configured for biasing into a reverse-biased diode configuration. In operation, the pn junction is sufficiently biased to preclude electrical shorting between the conductive line and the substrate for selected magnitudes of electrical current provided through the conductive line and the conductive material forming the conductive contacts.

BRIEF DESCRIPTION OF THE DRAWINGS

Preferred embodiments of the invention are described below with reference to the following accompanying drawings.

FIG. 4 is a top plan view of a circuit layout in accordance with one embodiment of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 2:
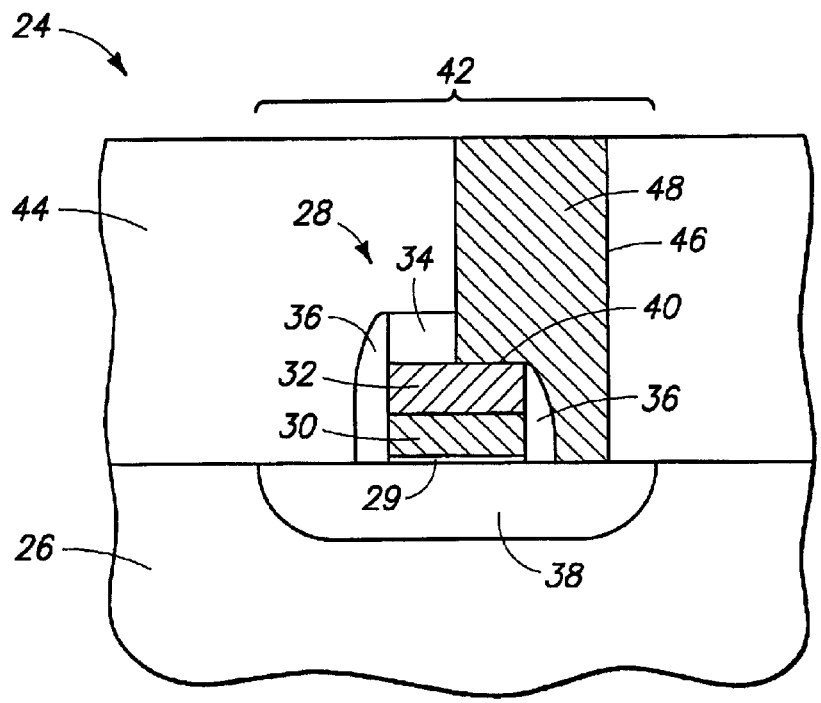
FIG. 2 is a diagrammatic side sectional view of a semiconductor wafer fragment in accordance with one embodiment of the invention.
Figure 3:
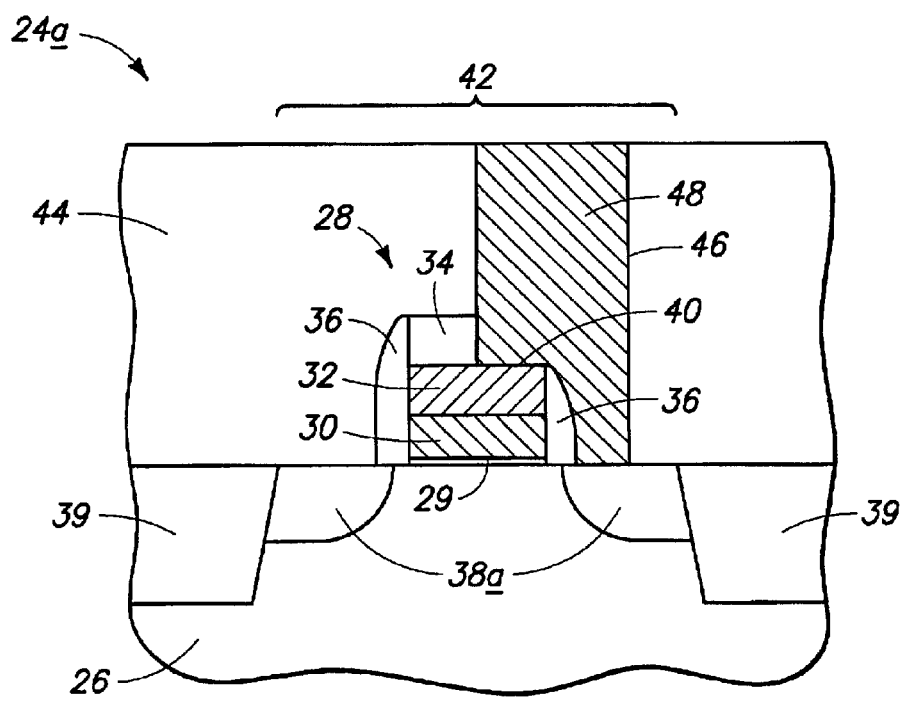
FIG. 3 is a diagrammatic side sectional view of the semiconductor wafer fragment in accordance with another embodiment of the invention.

Referring to FIGS. 2–4, separate embodiments of the present invention are shown and include a semiconductor wafer fragment generally at 24 (FIG. 2), 24a (FIG. 3) including a semiconductive substrate 26. Like numerals are utilized between the figures, with differences being indicated with the suffix "a" or "b", or with different numerals. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 26 comprises a first-type dopant which can be either p-type or n-type.

A plurality of conductive lines 28 are formed over substrate 26 and include a gate oxide layer 29, polysilicon layer 30, a silicide layer 32, an insulative cap 34, and sidewall spacers 36. Other conductive line constructions are possible. Diffusion regions 38 (FIG. 2), 38a (FIG. 3), and 38b (FIG. 4) are formed within substrate 26 and elevationally lower than conductive lines 28. In one embodiment, dynamic random access memory (DRAM) circuitry is formed over and supported by substrate 26, with conductive lines 28 comprising individual word lines. DRAM circuitry typically includes storage cells which are disposed within a memory array, and a peripheral area proximate the memory array. The storage cells include a storage capacitor which is operably coupled with a word line through a diffusion region. Storage capacitors typically include a storage node layer, a dielectric layer, and a cell plate layer. The word lines extend through the memory array and the peripheral area proximate the memory array Diffusion regions 38 can be formed in the peripheral area of the substrate outside of the memory array.

In one embodiment (FIG. 2), diffusion regions 38 can be formed prior to formation of conductive lines 28. Such permits the conductive lines to be formed over the diffusion regions so that the diffusion regions extend directly under conductive portions of the conductive lines. In another, more-preferred embodiment (FIG. 3), two individual diffusion regions 38a are formed after formation of conductive lines 28, and on each side thereof. A pair of isolation oxide regions 39 can be provided as shown. Individual diffusion regions 38, 38a–b are disposed operably proximate respective individual conductive line portions 40 and define areas which are comprised of a second-type dopant which is different from the first-type dopant comprising the substrate. Where substrate 26 comprises p-type dopant, diffusion regions 38, 38a–b comprise n-type dopant. Conversely, where substrate 26 comprises n-type dopant, diffusion regions 38, 38a–b comprise p-type dopant. The diffusion regions and conductive line portions 40 collectively effectively define individual contact pads 42 with which electrical and physical connection is desired. The diffusion regions and substrate provide a pn junction which can be configured into a reverse-biased diode configuration during operation, as will become apparent below.

A layer of insulative material 44 is formed over substrate 26 including line portions 40 and diffusion regions 38, 38a–b. An exemplary material is borophosphosilicate glass. Contact openings 46 are formed through layer 44 and expose portions of individual contact pads 42. Contact openings 46 can overlap with individual conductive lines and their associated diffusion regions as shown. Conductive contacts 48 are formed or deposited within contact openings 46 and in electrical connection with the individual contact pads 42. In a preferred embodiment, conductive contacts 48 comprise metal such as tungsten, including metal alloys. In the illustrated example, conductive contacts 48 provide conductive material which is received over the conductive lines and interconnects the line with its associated diffusion region. Accordingly, material of contacts 48 electrically contacts both conductive lines 28 and their respective diffusion regions 38, 38a–b.

Referring to FIG. 4, individual conductive lines 28 have second conductive line portions 50 which are joined with respective first conductive line portions 40 and in electrical communication therewith. Individual conductive lines 28 have pitches P relative to respective next adjacent lines. At least one, and preferably a plurality of the conductive lines have a pitch P between its first conductive line portion 40 and a next adjacent line which is substantially the same as a pitch between its second conductive line portion 50 and the next adjacent line. In the illustrated example, individual conductive lines 28 each have a lateral width dimension W away from its conductive line portion 40 which is substantially equivalent to the lateral width dimension of its conductive line portion 40. Preferably, the conductive lines have substantially equivalent lateral width dimensions.

Alternately considered, each conductive line has an average lateral width dimension W. Conductive line portions 40 have lateral width dimensions which are substantially equivalent to the average lateral width dimension of its associated conductive line. Such provides the conductive lines to have a generally uniform lateral width dimension along their respective entireties.

One advantage provided by the invention is that conductive lines 28 can be formed to have pitches which are more defined by minimum photolithographic feature sizes, without the lines having widened contact pads comprising material of the conductive lines. Thus, contact openings 46 can be formed over every other line (FIG. 4) along a generally straight line 52. There is no spacing-induced need to stagger the contact openings because the widened contact or landing pads can be eliminated.

Figure 1:
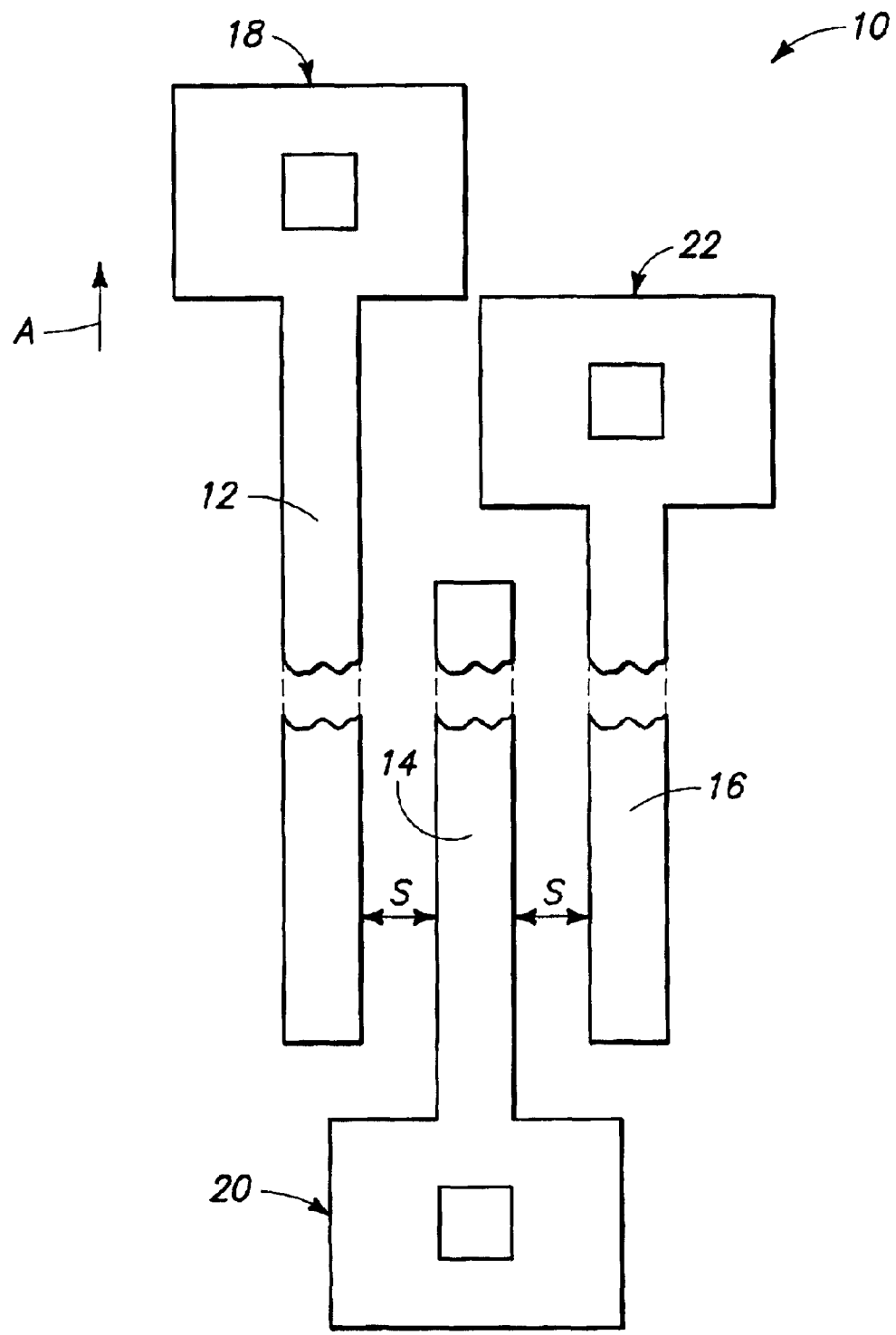
FIG. 1 is a top plan view of a portion of a prior art circuit layout.

Integrated circuitry formed in accordance with the inventive methods can provide a reverse-biased pn junction elevationally lower than one or more conductive lines, e.g. lines 30, 32, and 50. Electrical current may be provided through conductive lines 30, 32, and 50 and conductive material forming conductive contacts 48, with a reverse-biased pn junction between regions 38, 38a and substrate 26 being sufficiently reverse biased to preclude electrical shorting between conductive lines 30, 32 and 50, and substrate 26. Conventionally, in a DRAM, substrate 26 is biased to a negative voltage level $V_{bb}$ on the order of 1 volt, and it is anticipated that voltage on contact via 48 is maintained in reverse bias, e.g. 0 volts. This allows for a reduction in wafer real estate which was formerly required to accommodate the widened contact pads (FIG. 1).

As an example, where substrate 26 comprises p-type material, the substrate can be provided at a voltage potential of −1 volt, and conductive contact 48 can be grounded to provide the desired reversed bias. Where substrate 26 comprises n-type material, the substrate can be biased at a voltage potential of around 4 volts, with conductive contact 48 being biased at around 2 volts to provide the desired reversed bias. Other advantages of the present invention include a reduction in circuit layout area as well as an increased number of contacts being provided in the same substrate wafer area.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of contacting a line comprising:
    providing a substrate;
    forming a conductive line over the substrate;
    forming at least one individual diffusion region within the substrate proximate the conductive line; and
    forming conductive material in electrical contact with a portion of the conductive line and with a portion of the at least one individual diffusion region, the electrical contact with the portion of the at least one individual diffusion region comprising the only electrical contact of the conductive material with a diffusion region.

2. The method of claim 1 further comprising forming an other individual diffusion region within the substrate proximate the conductive line.

3. The method of claim 1 wherein the conductive line portion and the at least one individual diffusion region portion form a contact pad.

4. The method of claim 1 wherein the forming of the conductive line comprises forming the conductive line to have an average lateral width dimension, and wherein the conductive line portion has a lateral width dimension which is substantially equivalent to the average lateral width dimension.

5. The method of claim 1 wherein the forming of the conductive line comprises forming the conductive line to have a generally uniform lateral width dimension along its entirety.

6. The method of claim 1 wherein the forming of the diffusion region defines a pn junction within the substrate, and further comprising reverse biasing the pn junction.

7. The method of claim 1 wherein the forming of the diffusion region defines a pn junction within the substrate, and further comprising reverse biasing the pn junction after the forming of the conductive material.

8. A method of contacting a line comprising:

providing a substrate;

forming a conductive line over the substrate, the conductive line comprising a lateral width dimension defined by opposing sidewalls;

forming a diffusion region within the substrate and directly under an entirety of the lateral width dimension of the conductive line; and forming conductive material in electrical contact with the conductive line and the diffusion region.

9. The method of claim 8 wherein the forming of the diffusion region comprises forming at least a portion of the diffusion region laterally outward of at least one sidewall of the conductive line.

10. The method of claim 8 wherein the forming of the diffusion region comprises forming portions of the diffusion region laterally outward of the respective sidewalls of the conductive line.

11. The method of claim 8 wherein the forming of the diffusion region comprises forming portions of the diffusion region laterally outward of the respective sidewalls of the conductive line, and wherein the forming of the conductive material comprises forming the conductive material in electrical contact with at least one of the portions of the diffusion region.

12. The method of claim 8 wherein the providing of the substrate comprises providing the substrate to have a first-type dopant, and wherein the forming of the conductive line comprises forming the conductive line to have a second-type dopant which is different from the first-type dopant.

13. The method of claim 12 wherein the first-type dopant comprises n-type dopant.

14. The method of claim 12 wherein the first-type dopant comprises p-type dopant.

15. The method of claim 8 wherein the forming of the conductive line comprises forming a first conductive layer over a second conductive layer.

16. The method of claim 15 wherein the first conductive layer comprises material different from material of the second conductive layer.

17. A method of forming an electrical contact in a semiconductor device comprising:

providing a substrate;

forming a conductive line over the substrate, the line comprising a first portion;

forming a single diffusion region proximate the conductive line within the substrate, the first portion and the single diffusion region forming a contact pad;

forming an insulative material over the substrate and contact pad;

forming a contact opening through the insulative material, the opening exposing at least a portion of the contact pad; and forming conductive material over and electrically coupled to the exposed portion of the contact pad.

18. The method of claim 17 wherein the forming of the contact opening comprises forming the opening to overlap with the conductive line and the single diffusion region.

19. The method of claim 17 wherein the forming of the conductive line comprises forming a first conductive layer over a second conductive layer.

20. The method of claim 17 wherein the forming of the conductive material comprises forming metal material electrically coupled to the exposed portion of the contact pad.

* * * * *

UNITED STATES PATENT AND TRADEMARK OFFICE
CERTIFICATE OF CORRECTION

PATENT NO. : 6,790,663 B2
DATED : September 14, 2004
INVENTOR(S) : Robert Kerr et al.

It is certified that error appears in the above-identified patent and that said Letters Patent is hereby corrected as shown below:

Title page,
Item [56], References Cited, OTHER PUBLICATIONS, please insert -- Gray & Meyer, "Analysis and Design of Analog Integrated Circuits", Third Edition, John Wiley & Sons, Inc., 1993, pg. 169 --.

Column 2,
Line 65, please delete "array Diffusion" after "memory" and insert -- array. Diffusion --.

Signed and Sealed this

Nineteenth Day of April, 2005

JON W. DUDAS
*Director of the United States Patent and Trademark Office*